United States Patent
Jeon

(10) Patent No.: US 12,024,031 B2
(45) Date of Patent: Jul. 2, 2024

(54) METHOD OF CONTROLLING ELECTRIC POWER SUPPLY SYSTEM FOR MILD HYBRID ELECTRIC VEHICLE

(71) Applicant: HYUNDAI KEFICO CORPORATION, Gunpo-si (KR)

(72) Inventor: Byung Chun Jeon, Seongnam-si (KR)

(73) Assignee: HYUNDAI KEFICO CORPORATION, Gunpo-si (KR)

(*) Notice: Subject to any disclaimer, the term of this patent is extended or adjusted under 35 U.S.C. 154(b) by 857 days.

(21) Appl. No.: 17/117,296

(22) Filed: Dec. 10, 2020

(65) Prior Publication Data

US 2021/0178903 A1 Jun. 17, 2021

(30) Foreign Application Priority Data

Dec. 13, 2019 (KR) .................. 10-2019-0166489

(51) Int. Cl.
*B60L 3/00* (2019.01)
*B60L 50/64* (2019.01)
*G01R 31/3835* (2019.01)
*B60L 50/60* (2019.01)

(52) U.S. Cl.
CPC .............. *B60L 3/0046* (2013.01); *B60L 50/64* (2019.02); *G01R 31/3835* (2019.01); *B60L 50/66* (2019.02); *B60L 2240/547* (2013.01)

(58) Field of Classification Search
CPC ........ B60L 3/0046; B60L 50/64; B60L 50/66; B60L 2240/547; B60L 53/20; B60L 2210/10; G01R 31/3835; Y02T 10/70; Y02T 10/7072; Y02T 90/14; B60W 20/10; B60W 10/06; B60W 10/26; B60W 20/13; B60W 20/50; B60Y 2200/92

See application file for complete search history.

(56) References Cited

U.S. PATENT DOCUMENTS

| | | | | |
|---|---|---|---|---|
| 10,164,522 | B2* | 12/2018 | Kashyap | .................. B60L 53/20 |
| 2013/0314012 | A1* | 11/2013 | Cho | ........................ B60L 3/003 |
| | | | | 318/400.21 |

FOREIGN PATENT DOCUMENTS

| | | | |
|---|---|---|---|
| JP | 6329864 B2 | 5/2018 |
| KR | 10-2009-0039891 A | 4/2009 |
| KR | 10-1521985 B1 | 5/2015 |
| KR | 10-2015-0121639 A | 10/2015 |
| KR | 10-1587358 B1 | 1/2016 |
| KR | 10-2017-0013445 A | 2/2017 |
| KR | 10-2017-0108592 A | 9/2017 |

(Continued)

*Primary Examiner* — Shon G Foley
(74) *Attorney, Agent, or Firm* — Lempia Summerfield Katz LLC

(57) ABSTRACT

A method of controlling an electric power supply system for a mild hybrid electric vehicle includes: a step of executing a sequence for turning on the electric power supply system, wherein when an ignition key is turned on, a voltage of the low voltage battery is boosted and in which, when the voltage of the high voltage power network reaches a preset setting voltage, the high voltage relay is closed; a step of causing the vehicle to travel in a normal mode; a step of limiting entering of a failure mode and checking a connected state of the high voltage relay when a voltage drop occurs; and a step of performing again the sequence, when the high voltage relay is opened, and of resuming the traveling of the vehicle in the normal mode when the high voltage relay keeps closed.

5 Claims, 7 Drawing Sheets

(56) References Cited

FOREIGN PATENT DOCUMENTS

KR    10-2018-0115109 A    10/2018
KR    10-1975122 B1    5/2019

\* cited by examiner

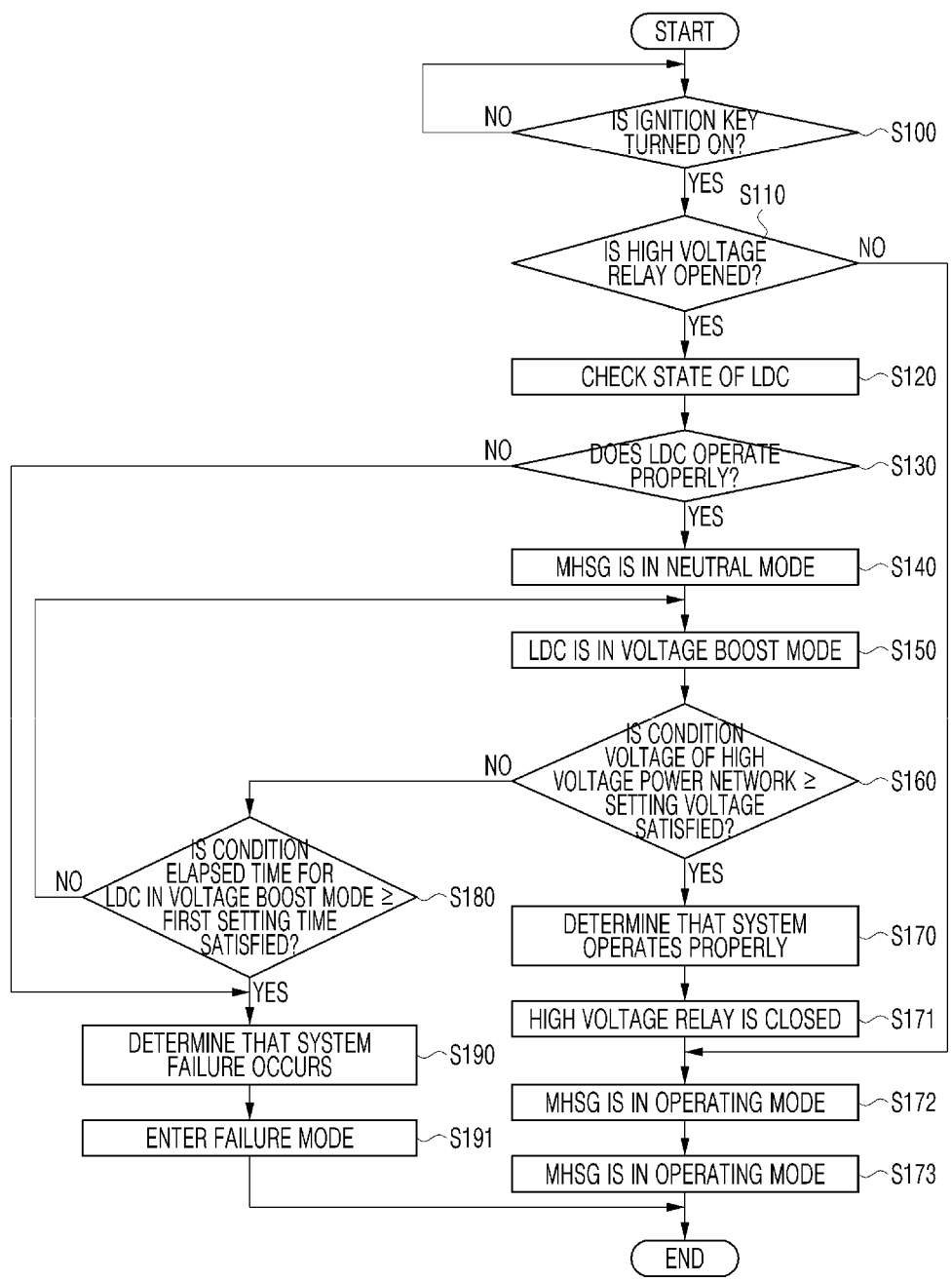

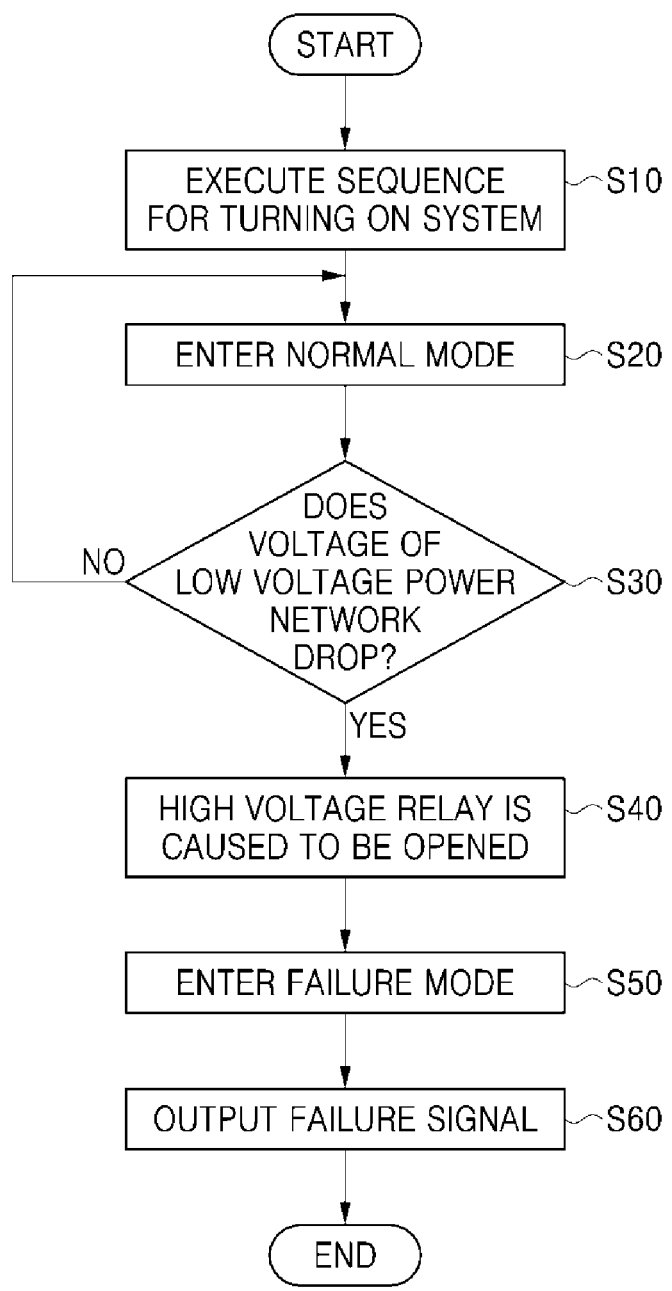
FIG.4 "PRIOR ART"

METHOD OF CONTROLLING ELECTRIC POWER SUPPLY SYSTEM FOR MILD HYBRID ELECTRIC VEHICLE

CROSS REFERENCE TO RELATED APPLICATION

This application claims priority to and the benefit of Korean Patent Application No. 10-2019-0166489, filed on Dec. 13, 2019, the entire contents of which are incorporated herein by reference.

FIELD

The present disclosure relates to a method of controlling an electric power supply system for a mild hybrid electric vehicle and, more particularly, to a method of controlling an electric power supply system for a mild hybrid electric vehicle, which is capable of preventing a temporary voltage drop in a voltage power network.

BACKGROUND

The statements in this section merely provide background information related to the present disclosure and may not constitute prior art.

A mild hybrid electric vehicle is a type of hybrid vehicle that drives a motor if necessary and thus provides an output in a manner auxiliary to an engine. In the mild hybrid electric vehicle, a traveling mode in which the vehicle is driven only with a motor torque is not provided. However, in the mild hybrid electric vehicle, a torque is produced in addition to an engine torque using the motor according to a traveling state of the vehicle, and a battery (for example, a 48 V battery) is charged through regenerative braking. That is, the motor torque, as well as the engine torque, is provided to secure a torque required by a driver, and thus quick responsiveness is provided. Furthermore, fuel efficiency is improved by using electric power produced with the regenerative braking.

An electric power supply system for the mild hybrid electric vehicle has two electric power supply components: a low voltage power network and a high voltage power network. The high voltage power network is responsible for driving the motor or supplying electric power for driving various systems. The low voltage power network is responsible for supplying electric power to a starting motor. However, like in a case where the starting motor is driven, when a high voltage is required instantaneously, the low voltage power network is in a temporary low voltage state. This low voltage state is a temporary phenomenon and does not result from a failure occurring in the electric power supply system. However, we have discovered that electric power supply systems in the related art recognize the low voltage state as the occurrence of the failure. Accordingly, the vehicle enters a failure mode unnecessarily, and thus travels in a restricted manner. This situation is recognized as a factor for decreasing quality of the vehicle.

The foregoing is intended merely to aid in the understanding of the background of the present disclosure, and is not intended to mean that the present disclosure falls within the purview of the related art that is already known to those skilled in the art.

SUMMARY

The present disclosure provides a method of controlling an electric power supply system, which is capable of preventing a vehicle from entering a failure mode in a case where a temporary voltage drop occurs in the electric power supply system, and of causing the electric power supply system to resume proper operating.

However, the present disclosure is not limited to the above-described objective. Other various objectives of the present disclosure will be achieved without departing from the technical idea and scope of the present disclosure.

According to an aspect of the present disclosure, a method of controlling an electric power supply system for a mild hybrid electric vehicle includes: a step of executing a sequence for turning on the electric power supply system, wherein when an ignition key or a start button is turned on, a voltage of the low voltage battery is boosted, thereby increasing a voltage of the high voltage power network and in which, when the voltage of the high voltage power network reaches a preset setting voltage or higher, the high voltage relay is closed for connection; a step of traveling of a vehicle in a normal mode, wherein the vehicle travels according to an operation by a driver after the sequence for turning on the system is fully executed; a holding-off step of limiting entering of a failure mode and checking a connected state of the high voltage relay when a voltage drop occurs in the low voltage power network; and a cancelation step of performing again the sequence for turning on the system, when the high voltage relay is opened, and of no longer limiting the entering of the failure mode and then resuming the traveling of the vehicle in the normal mode when the high voltage relay keeps closed for connection.

In the method, the step of executing the sequence for turning on the system may include: a checking step of checking an operating state of the LDC when the ignition key or the start button is turned on; a voltage boost mode step of enabling the LDC to boost the voltage of the low voltage battery and to supply a resulting voltage to the high voltage power network, thereby increasing the voltage of the high voltage power network, when the LDC is in a normal state; a connection step of closing the high voltage relay for connection when the voltage of the high voltage power network reaches the preset setting voltage or higher; and a voltage reduction mode (forward mode or buck mode) step of interrupting a voltage increase through the LDC, reducing the voltage of the high voltage battery, and supplying a resulting voltage to the low voltage power network.

The method may further include a step of operating a mild hybrid starter generator (MHSG) using the high voltage battery when the high voltage relay is closed for connection.

The method may further include a step of outputting a system failure signal in a case where a preset setting time elapses after the voltage boost mode step is performed, but where the voltage of the high voltage power network is lower than the setting voltage.

In the method, the low voltage battery may supply a voltage of 12 V, and the high voltage battery may supply a voltage of 48 V.

In the method, in the holding-off step, when the voltage of the low voltage power network drops to or below a preset reference voltage, it may be determined that the voltage drop occurs.

The method of controlling the electric power supply system for the mild hybrid electric vehicle according to the present disclosure can prevent a temporary voltage drop phenomenon occurring in the electric power supply system from resulting in a failure mode being entered and can perform control in such a manner that the electric power supply system resumes proper operating. Accordingly, unnecessary entering of the failure mode can be prevented, and the reliability of control of the vehicle can be improved.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 2 is a flowchart illustrating a method of performing control through a sequence for turning on a system using the electric power supply system for the mild hybrid electric vehicle in one form of the present disclosure;

Figure 5:
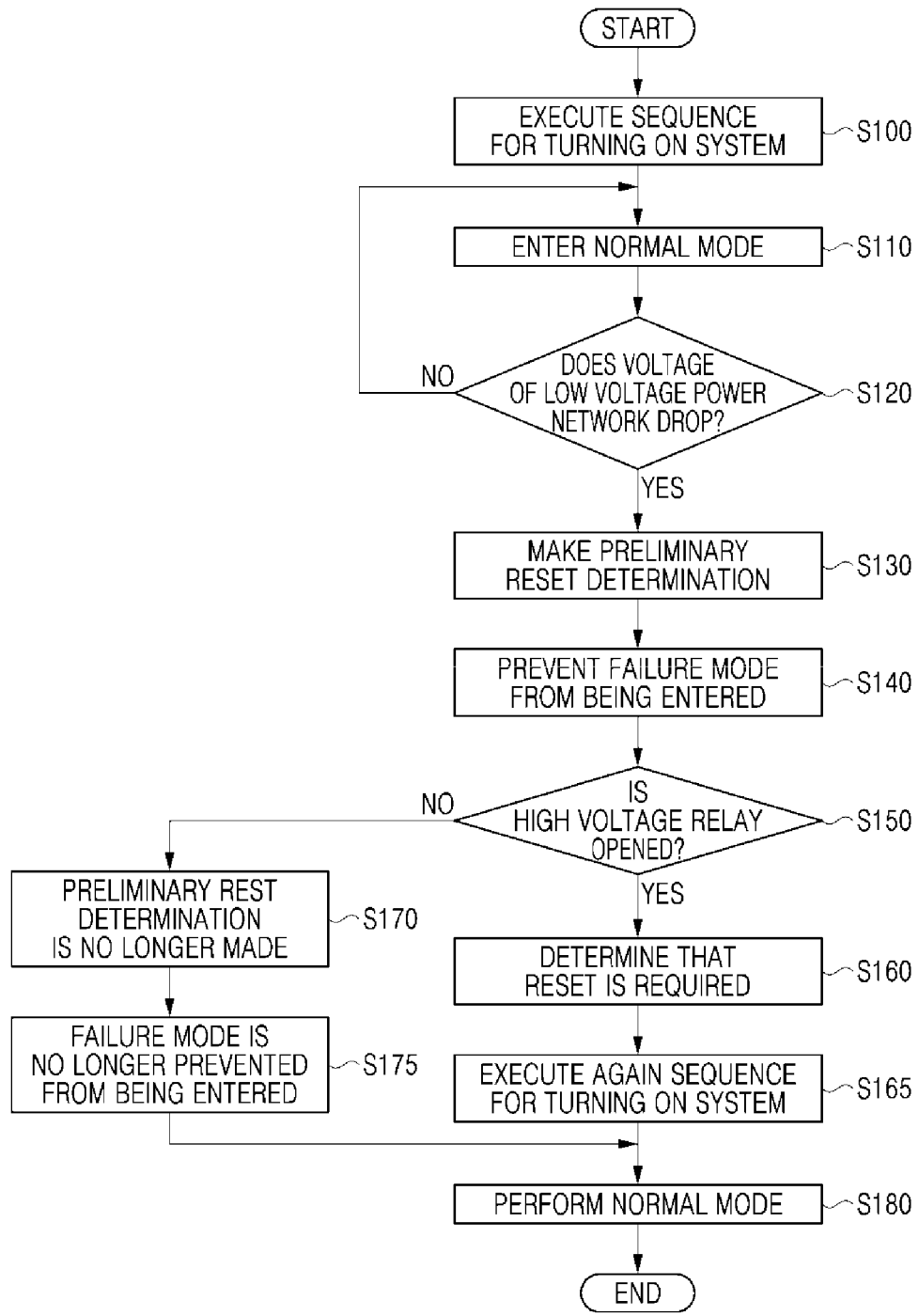

FIGS. 3A, 3B, 3C, 3D, and 3E are graphs illustrating an operating state of the system, the graphs respectively showing results of performing the steps in FIG. 2;

FIG. 4 is a flowchart illustrating a method of performing control when a low voltage occurs in a mild hybrid electric vehicle in the related art; and FIG. 5 is a flowchart illustrating steps of a method of controlling an electric power supply system for a mild hybrid electric vehicle according to one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

For the purpose of illustration only, forms of the present disclosure for disclosure in the specification will be described in terms of specific structures and functions. The exemplary forms of the present disclosure can be implemented in various ways and should not be construed as limiting the present disclosure.

Various modifications can be made to the present disclosure, thereby creating various forms. All alterations, equivalents, and substitutes that are included within the technical idea of the present disclosure should be understood as falling within the scope of the present disclosure.

The terms first, second, and so on are used to describe various constituent elements but should not impose any limitation on the meanings of the constituent elements. These terms are used only to distinguish one element from another. For example, a first constituent element may be expressed as a second constituent element without departing from the scope of the present disclosure. Similarly, the second constituent element may also be expressed as the first constituent element.

It should be understood that, when a constituent element is referred to as being "coupled to" or "connected to" a different constituent element, this means that the constituent element may be coupled to or connected to the different constituent element or means that an intervening constituent element may be present therebetween. In contrast, it should be understood that, when a constituent element is referred to as being "directly coupled to" or "directly connected to" a different constituent element, this means that no intervening constituent element is present therebetween. Expressions describing a relationship between constituent elements, such as "between" and "directly between", and "adjacent to" and "directly adjacent to", should be construed in the same manner.

The tams used in the specification are only for describing specific forms and are not intended to limit the present disclosure. A noun in the singular is construed as that in the plural, except as distinctively expressed in context. It should be understood that, throughout the present specification, the term "include", "have", or the like is intended to indicate that a feature, a number, a step, an operation, a constituent element, a component, or any combination thereof is present, without precluding the presence or addition of one or more other features, numbers, steps, operations, constituent elements, or any combination thereof.

Unless otherwise defined, throughout the specification, each of all terms including technical or scientific terms has the same meaning as is normally understood by a person of ordinary skill in the art to which the present disclosure pertains. The term as defined in commonly used dictionaries should be construed as having the same meaning in context as that in the related art and, unless otherwise explicitly defined in the specification and should not be construed as having an excessively implied meaning or a purely literal meaning.

An exemplary form of the present disclosure will be described in more detail below with reference to the accompanying drawings. Like constituent elements in the drawings are given like reference characters, and only one of the like constituent elements is described.

Figure 1:
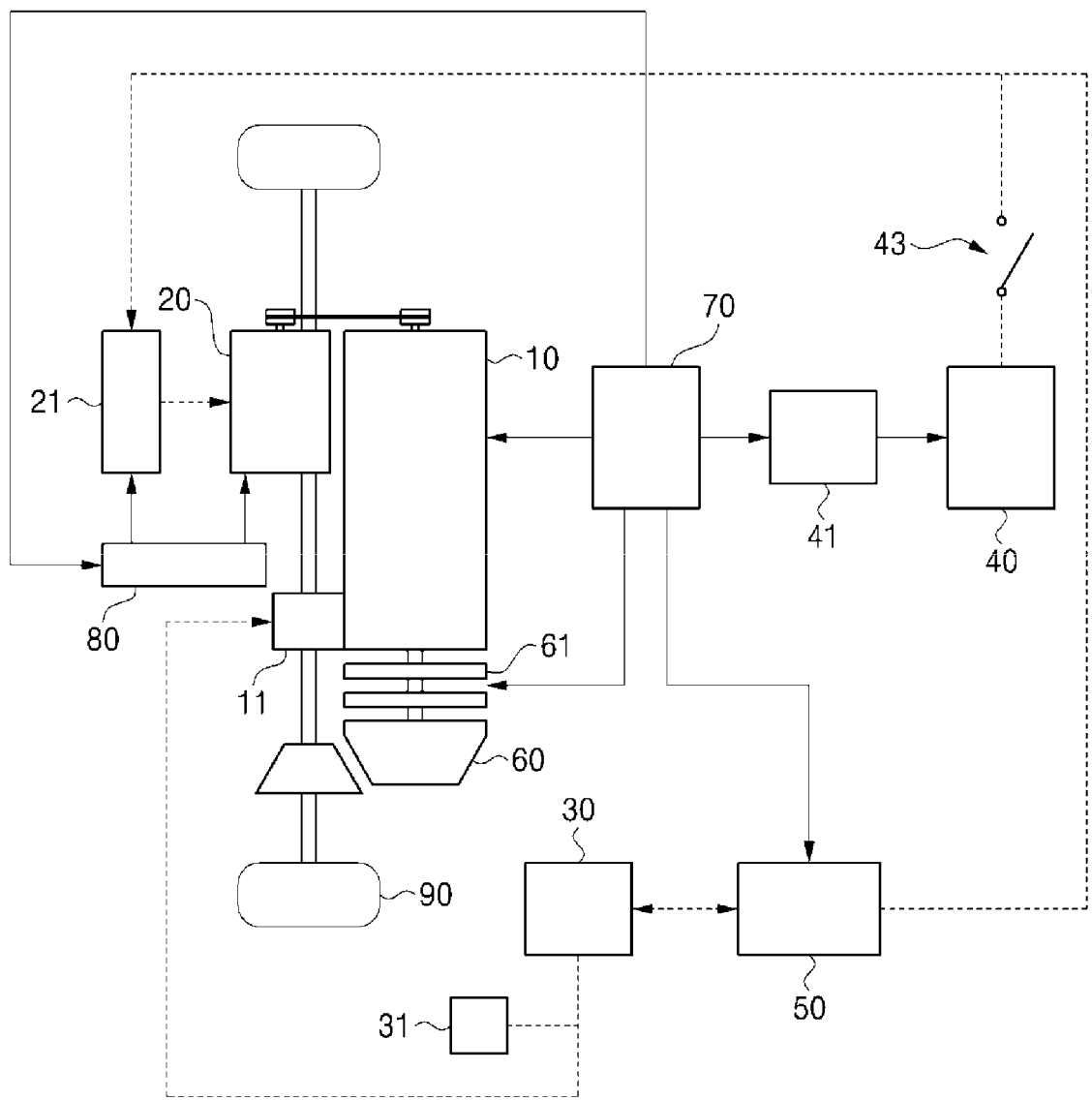
FIG. 1 is a block diagram illustrating an electric power supply system for a mild hybrid electric vehicle according to one form of the present disclosure.

FIG. 1 is a block diagram illustrating an electric power supply system for a mild hybrid electric vehicle according to one form of the present disclosure. In FIG. 1, a solid line represents a flow of a control signal, and a dotted line represents a flow of electric power.

With reference to FIG. 1, the mild hybrid electric vehicle is driven by motive power generated by an engine 10 and motive power generated by a mild hybrid starter generator (MHSG) 20.

The engine 10 is started by a starting motor 11, and after started, is driven by combusting fuel. The starting motor 11 is driven using a low voltage battery 30. The low voltage battery 30, for example, is a 12 V battery.

The MHSG 20 is driven using a high voltage battery 40 and generates motive power in a manner auxiliary to the engine 10. Operation of the high voltage battery 40 is controlled by a battery management unit 41, and electric power of the high voltage battery 40 is supplied to the MHSG 20 through an inverter 21. In addition, during regenerative braking, electric power generated by the MHSG 20 is supplied to the high voltage battery 40 through the inverter 21.

The MHSG 20 operates in a non-operating mode, a neutral mode, an operating mode, and the like. In the non-operating mode, supply of electric power to the MHSG 20 is interrupted. In the operating mode, the vehicle travels, and the MHSG 20 produces motive power or generates electric power through regenerative braking. The neutral mode is entered when transitioning from the non-operating mode to the operating mode or from the operating mode to the non-operating mode is required.

Motive power shafts of the engine 10 and the MHSG 20 are coupled to each other with a belt or the like. Thus, the MHSG 20 is driven using an output torque of the engine 10. In this case, the MHSG functions as a generator charging the high voltage battery 40. Charging the high voltage battery 40 using the output torque of the engine 10 is referred to as regenerative braking. In this case, the high voltage battery 40 is charged. Operation of the MHSG 20 and operation of the inverter 21 are controlled by a motor control unit (MCU) 80.

The battery management unit 41 controls a state of charge (SOC) of the high voltage battery 40. That is, the battery management unit 41 recognizes the state of charge of the high voltage battery 40 and selectively controls charging and discharging of the high voltage battery 40 in such a manner that over-charging or over-discharging does not occur. The battery management unit 41, for example, is a battery management system (BMS).

The high voltage battery 40 transfers electric power to the low voltage battery 30 through a low voltage DC-DC converter (LDC) 50 and thus charges the low voltage battery 30. The high voltage battery 40, for example, is a 48 V battery.

The electric power supply system for the mild hybrid electric vehicle according to one form of the present disclosure includes a low voltage power network, a high voltage power network, an LDC 50, and a vehicle controller 70. In the low voltage power network, the low voltage battery 30 is a primary component. In the high voltage power network, the high voltage battery 40 is a primary component. The LDC 50 transfers electric power between the low voltage power network and the high voltage power network. The vehicle controller 70 controls operation of each of the low voltage power network and the high voltage power network.

The low voltage power network may be a system, such as the low voltage battery 30 or an electric resistor 31, that operates on a low voltage (for example, 12 V). In contrast, the high voltage power network may be a system, such as the high voltage battery 40, the MHSG 20, the inverter 21, a high voltage relay 43, or the battery management unit 41, that operates on a high voltage (for example, 48 V). In this case, supply of electric power from the high voltage battery 40 to the high voltage power network is regulated by the high voltage relay 43. That is, when the high voltage relay 43 is closed for connection, the electric power of the high voltage battery 40 is supplied to the high voltage power network, and when the high voltage relay 43 is opened, supply of the electric power of the high voltage battery 40 to the high voltage power network is interrupted.

The LDC 50 serves to transfer electric power between the high voltage power network and the low voltage power network. For example, the LDC 50 operates in a voltage boost mode and a voltage reduction mode. In the voltage boost mode, the LDC 50 boosts a low voltage of the electric power of the low voltage power network and transfers a resulting voltage to the high voltage power network. In the voltage reduction mode (forward mode or buck mode), the LDC 50 reduces a high voltage of the electric power of the high voltage power network and transfers a resulting voltage to the low voltage power network.

A power-off mode, a testing mode, the voltage boost mode, the voltage reduction mode, and a transition mode, represent operating states, respectively, of the TDC 50. The power-off mode represents an operating state where electric power is not supplied to the LDC 50. The testing mode is entered before electric power is supplied to the LDC 50. In the testing mode, it is checked whether or not the LDC 50 operates properly. The voltage boost mode represents an operating state where the LDC 50 boosts a low voltage of the low voltage power network and transfers a resulting voltage to the high voltage power network. The voltage reduction mode represents an operating state where the LDC reduces a high voltage of the high voltage power network and transfers a resulting voltage to the low voltage power network. The transition mode is a neutral mode that is entered when transitioning from the voltage reduction mode to the power-off mode is required. In the transition mode, self-diagnosis, error storage, or the like is performed. In addition, in the transition mode, transfer of electric power between the low voltage power network and the high voltage power network is interrupted.

Drive power generated in the engine 10 and drive power generated in the MHSG 20 are transferred to a wheel 90 through a transmission 60. In this case, a transmission clutch 61 is provided between the engine 10 and the transmission 60. The transmission clutch 61 regulates transfer of motive power from the engine 10 to the transmission 60. That is, when the transmission clutch 61 is engaged, motive power of the engine 10 is transferred to the wheel 90 through the transmission 60, and when the transmission clutch 61 is disengaged, transfer of motive power to the wheel 90 is interrupted.

The vehicle controller 70 is a highest-level controller that controls operation of the vehicle. The vehicle controller 70 controls output torques of the engine 10 and the MHSG 20. For example, the vehicle controller 70 is an electronic control unit (ECU).

The vehicle controller 70 selectively drives the engine 10 and the MHSG 20 according to a torque required by a driver and a state of the vehicle. Specifically, the vehicle controller 70 determines a torque distribution ratio between the engine 10 and the MHSG 20 on the basis of preset map data according to a state of driving on a road, the torque required by the driver, a charged state of the battery, and the like. For example, when the torque required by the driver is small, an output is produced by driving only the engine 10, and when the torque required by the drives increases, an output is produced by driving the engine 10 and the MHSG 20 together.

As described above, the electric power supply system for the mild hybrid electric vehicle supplies necessary electric power to a group of components that need a low voltage and a group of components that need a high voltage. In addition, supply of electric power to the high voltage power network is regulated by the high voltage relay 43. That is, when the vehicle is traveling, the high voltage relay 43 is closed for connection, and thus the electric power of the high voltage battery 40 is supplied to the high voltage power network, and after the engine 10 stalls, the high voltage relay 43 is opened, and thus supply of electric power to the high voltage power network is interrupted. Therefore, when the ignition key or the start button is turned on, a set of steps of stably closing the high voltage relay 43 for connection is required. Likewise, after the ignition is turned off (when the start button is pushed), a set of steps of stably opening the high voltage relay 43 is required.

FIG. 2 is a flowchart illustrating steps of a method of performing control through a sequence for turning on a system in one form of the present disclosure. FIGS. 3A, 3B, 3C, 3D, and 3E are graphs, each illustrating an operating state of the system, that show results, respectively, of performing the steps in FIG. 2.

When the ignition key or the start button is turned on at a first point in time $T_1$ (S100), it is checked whether or not the high voltage relay 43 is opened (S110). The reason for this is that, when the high voltage relay 43 is already closed for connection, a set of steps of closing the high voltage relay 43 for connection is unnecessary.

When the high voltage relay 43 is opened, first, a state of the LDC 50 is checked (S120). It takes a very short time to enter the state checking for the LDC 50 after the ignition key or the start button is turned on. Thus, the checking of the state of the LDC 50 is regarded as being entered at the same time as the ignition key or the start button is turned on.

Specifically, the vehicle controller 70 transmits a testing signal to the LDC 50. When the LDC 50 responds to the testing signal and then enters a specific mode, for example, the testing mode, it is determined that the LDC 50 is in a normal state (S130). This determination is made between the first point in time $t_1$ and a second point in time $t_2$. In a case where the vehicle controller 70 transmits the testing signal, but where the LDC 50 does not enter the testing mode, it is determined that the LDC 50 is in a malfunctioning state. In this case, it is determined that a system failure occurs (S190), and a failure mode is entered (S191). The failure mode is a mode for limitedly operating the vehicle in an emergent situation such as occurrence of a failure.

When the LDC 50 is in the normal state, the MHSG 20 is caused to enter the neutral mode (S140). The neutral mode is entered at a third point in time $t_3$ in FIGS. 3A, 3B, 3C, 3D, and 3E. That is, Step S140 is performed before the MHSG 20 operates at full capacity. In Step S140, an operating state of the MHSG 20 is checked.

Thereafter, the LDC 50 is caused to enter the voltage boost mode, and thus a voltage of the high voltage power network is increased (S150). The LDC 50 is in the voltage boost mode during a period from a fourth point in time $t_4$ to a fifth point in time $t_5$ in FIGS. 3A, 3B, 3C, 3D, and 3E.

The high voltage relay 43 is opened in a state where the system is turned off. Therefore, the electric power of the high voltage battery 40 cannot be transferred to the high voltage power network, and a voltage is not present in the high voltage power network. Therefore, the LDC 50 boosts the voltage of the low voltage battery 30, and then a resulting voltage is transferred to the high voltage power network. Thus, the voltage of the high voltage power network is increased.

When the voltage of the high voltage power network is increased to or above a preset setting voltage $V_H$ (S160), it is determined that the electric power supply system is in a normal state (S170).

Figure 3A:
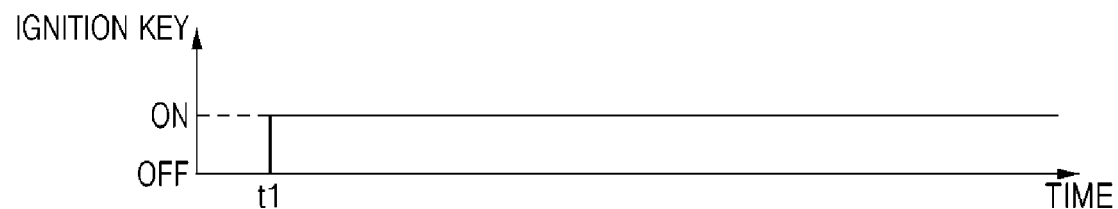
Figure 3B:
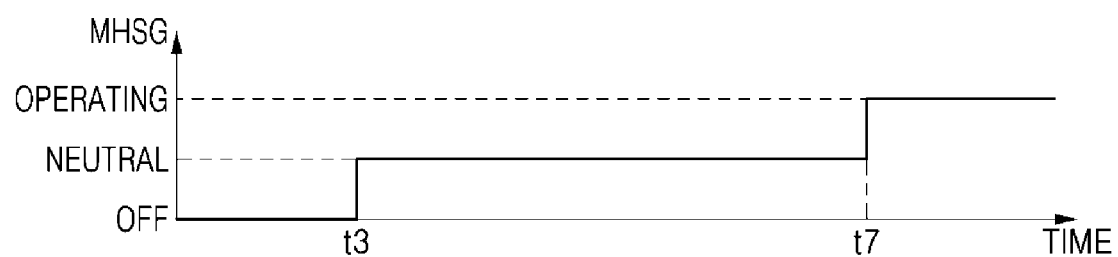
Figure 3C:
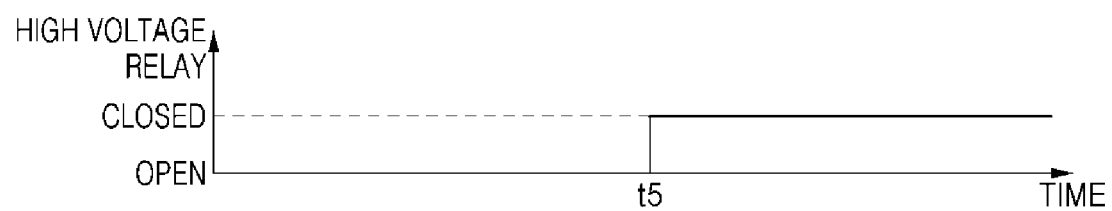
Figure 3D:
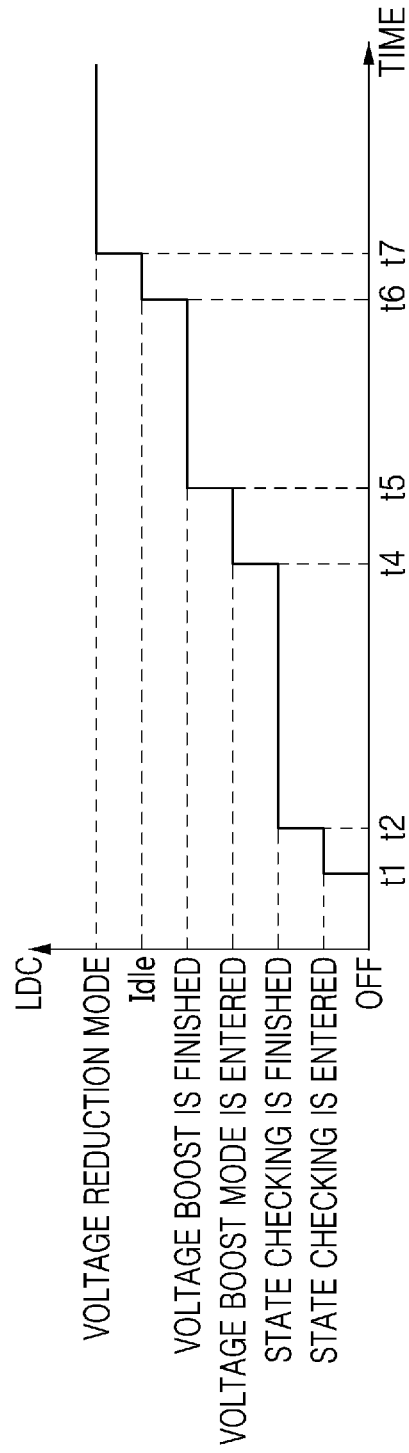
Figure 3E:
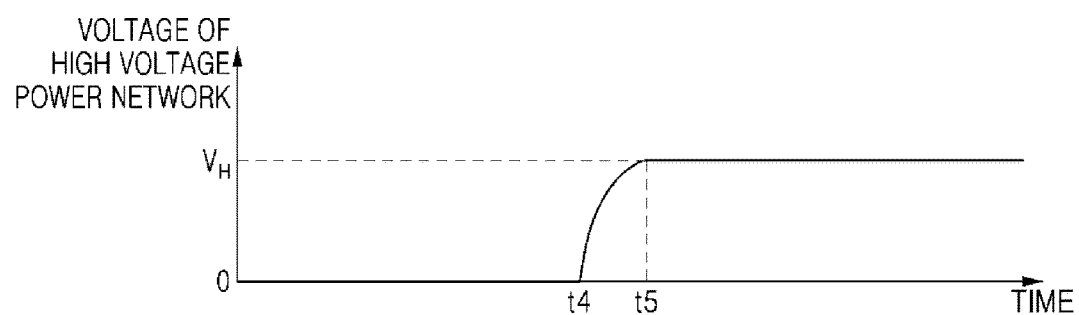

For example, as illustrated in FIGS. 3D and 3E, while the LDC 50 operates in the voltage boost mode, at a fifth point in time $t_5$, the voltage of the high voltage power network is increased to the setting voltage $V_H$. When this is done, it is determined that the electric power supply system is in the normal state. In this case, for example, the setting voltage $V_H$ is 48 V.

When the electric power supply system is in the normal state, the high voltage relay 43 is closed for connection (S171), the MHSG 20 is caused to enter the operating mode (S172), and the LDC 50 is caused to enter the voltage reduction mode (S173). In this manner, the voltage of the high voltage power network is sufficiently increased to the setting voltage $V_H$ and then the high voltage relay 43 is closed for connection. Thus, impact due to application of the high voltage can be prevented.

In a case where in the voltage boost mode, the LDC 50 is sufficiently driven for a preset first setting time or longer, but where the voltage of the high voltage power network is not increased to or above the setting voltage $V_H$ (S180), it is determined that the system is in a malfunctioning state (S190). In this case, a failure signal is output, and the failure mode is entered (S191). Thus, the electric power supply system can be prevented from being further damaged.

When the above-described sequence for turning on the system is fully executed, the vehicle travels in a normal state. For example, the vehicle travels by driving the engine 10 and the MHSG 20, or the high voltage battery 40 is charged through the regenerative braking. In contrast with the failure mode, this state is referred to as a "normal mode". In the normal mode, the output of the vehicle is determined according to the torque required by the driver, and the driver can perform all functions built into the vehicle. In contrast, in the failure mode, most functions other than functions required in case of emergency are disabled, and the output of the vehicle is decreased to a minimum.

However, after the vehicle enters the normal state, the low voltage power network may temporarily enter a low voltage state. For example, in a case where the starting motor 11 is driven to restart the engine 10, high electric power may be required instantaneously. However, in this case, the voltage of the low voltage power network may be decreased temporarily. In the related art, in methods of controlling an electric power supply system, this temporary decrease in the voltage is recognized as the failure state. This situation is illustrated in FIG. 4.

With reference to FIG. 4, the sequence for turning on the system is executed (S10), and then the vehicle travels in the normal mode (S20). While the vehicle is traveling and a voltage drop occurs in the low voltage power network (S30) due to some reason, the high voltage relay 43 is caused to be open (S40). Thereafter, the failure mode is entered (S50), and the failure signal is output (S60). In this case, because functions of the vehicle are limited, the vehicle has to be repaired in a service center. However, the voltage drop that occurs temporarily in the lower voltage power network while driving a high output component, such as the starting motor 11, cannot be regarded as occurrence of a failure. Therefore, the entering of the failure mode (S50), as described above, is unnecessary, and this situation may be recognized as a factor for decreasing quality of the vehicle. According to the present disclosure, the failure mode can be prevented from being entered in a temporary low voltage situation, thereby removing the factor for decreasing quality of the vehicle.

FIG. 5 is a flowchart illustrating steps of a method of controlling an electric power supply system for a mild hybrid electric vehicle according to one form of the present disclosure.

With reference to FIG. 5, when the sequence for turning on the system, which is illustrated in FIG. 2, is fully executed (S100), the vehicle travels in the normal mode (S110).

Thereafter, a voltage state of the low voltage power network is monitored. When the voltage drop occurs in the low voltage power network while the vehicle is traveling (S120), a preliminary reset determination is made (S130), and the failure mode is prevented from being entered (S140).

In the control method in the related art, illustrated in FIG. 4, when the voltage drop occurs in the low voltage power network, the high voltage relay 43 is immediately caused to be open, and the failure mode is entered. However, specifically, in the method according to the present disclosure, the failure mode is prevented from being entered and the preliminary reset determination is made. This is a difference from the control method in the related art. The reset here means that the sequence for turning the system, which is illustrated in FIG. 2, is performed again. That is, instead of entering the failure mode, the electric power supply system is compelled to operate properly through rebooting, if desired.

In addition, when the voltage of the low voltage power network drops to or below a preset reference voltage, it is determined that the voltage drop occurs in the low voltage power network. At this time, the reference voltage is appropriately selected according to specifications for the electric power supply system, or according to need. For example, when the voltage of the low voltage power network drops to or below 5 V, it is determined that the voltage drop occurs.

It is determined whether or not the reset is performed depending on whether or not the high voltage relay 43 keeps open (S150).

Specifically, when the high voltage relay 43 is already open due to the voltage drop (S120), it is determined that the reset has to be performed (S160), and the sequence for turning on the system of FIG. is performed again (S165). If the voltage drop (S120) is not a temporary phenomenon, the failure mode will be entered while the sequence for turning on the system is executed. If the voltage drop is simply a temporary phenomenon, stable returning to the normal mode will take place (S180).

In contrast, in a case where the high voltage relay 43 keeps closed for connection, there is no need to necessarily execute again the sequence for turning on the system. Therefore, in this case, the preliminary reset determination is no longer made (S170), and the failure mode is no longer prevented from being entered (S175).

As described above, the method of controlling the electric power supply system for the mild hybrid electric vehicle according to the present disclosure prevents the temporary voltage drop phenomenon occurring in the electric power supply system from resulting in the failure mode being entered, and performs control in such a manner that the electric power supply system resumes proper operating. Accordingly, the failure mode can be prevented from being entered unnecessarily, and the reliability of control of the vehicle can be improved.

Although the exemplary forms of the present disclosure have been described for illustrative purposes, those skilled in the art will appreciate that various modifications, additions and substitutions are possible, without departing from the scope and spirit of the present disclosure.

What is claimed is:

1. A method of controlling an electric power supply system for a mild hybrid electric vehicle, where the electric power supply system includes: a low voltage power network driven by a low voltage battery, and a high voltage power network driven by a high voltage battery, a low voltage DC-DC converter (LDC) configured to transfer electric power between the low voltage power network and the high voltage power network, and a high voltage relay configured to regulate electric power supply from the high voltage battery to the high voltage power network, the method comprising:

a step of executing a sequence for turning on the electric power supply system, wherein when an ignition key or a start button is turned on, a voltage of the low voltage battery is boosted, thereby increasing a voltage of the high voltage power network and in which, when the voltage of the high voltage power network reaches a preset setting voltage or higher, the high voltage relay is closed for connection;

a step of traveling the mild hybrid electric vehicle in a normal mode, wherein the mild hybrid electric vehicle travels according to an operation by a driver after the sequence for turning on the electric power supply system is fully executed;

a holding-off step of limiting entering of a failure mode and checking a connected state of the high voltage relay when a voltage drop occurs in the low voltage power network; and a cancelation step of performing again the sequence for turning on the electric power supply system, when the high voltage relay is opened, and of no longer limiting entering of the failure mode and then resuming the traveling of the vehicle in the normal mode when the high voltage relay keeps closed for connection.

2. The method of claim 1, wherein the step of executing the sequence for turning on the electric power supply system comprises:

a checking step of checking an operating state of the LDC when the ignition key or the start button is turned on;

a voltage boost mode step of enabling the LDC to boost the voltage of the low voltage battery and to supply a boosted voltage to the high voltage power network, thereby increasing the voltage of the high voltage power network, when the LDC is in a normal state;

a connection step of closing the high voltage relay for connection when the voltage of the high voltage power network reaches the preset setting voltage or higher; and a voltage reduction mode step of interrupting a voltage increase through the LDC, reducing the voltage of the high voltage battery, and supplying a reduced voltage to the low voltage power network.

3. The method of claim 2, further comprising:

a step of operating a mild hybrid starter generator (MHSG) by the high voltage battery when the high voltage relay is closed for connection.

4. The method of claim 2, further comprising:

a step of outputting a system failure signal in a case where a preset setting time elapses after the voltage boost mode step is performed, and where the voltage of the high voltage power network is lower than the setting voltage.

5. The method of claim 1, wherein in the holding-off step, when the voltage of the low voltage power network drops to or below a preset reference voltage, determining that the voltage drop occurs.

* * * * *